United States Patent
Baek

[11] Patent Number: 5,838,067
[45] Date of Patent: Nov. 17, 1998

[54] CONNECTING DEVICE FOR CONNECTING A SEMICONDUCTOR CHIP TO A CONDUCTOR

[75] Inventor: Young Sang Baek, Kunpo-Shi, Rep. of Korea

[73] Assignee: LG Electronics Inc., Seoul, Rep. of Korea

[21] Appl. No.: 649,022

[22] Filed: May 16, 1996

[30] Foreign Application Priority Data

Dec. 30, 1996 [KR] Rep. of Korea ................... 1995-69079

[51] Int. Cl.$^6$ ........................... H01L 23/48; H01L 23/52; H01L 29/40
[52] U.S. Cl. ........................... 257/737; 257/779; 257/780; 257/786
[58] Field of Search ..................... 252/737, 786, 252/779, 780

[56] References Cited

U.S. PATENT DOCUMENTS

| | | | |
|---|---|---|---|
| 3,585,461 | 6/1971 | Eynon et al. | 257/737 |
| 4,742,023 | 5/1988 | Hasegawa | 437/183 |
| 4,787,958 | 11/1988 | Lytle | 156/652 |
| 5,010,389 | 4/1991 | Gansauge et al. | 257/737 |
| 5,293,071 | 3/1994 | Erdos | 257/732 |
| 5,376,584 | 12/1994 | Agarwala | 438/614 |
| 5,631,499 | 5/1997 | Hosomi et al. | 257/737 |

OTHER PUBLICATIONS

Liquid Crystal Flat Panel Displays Manufacturing Science & Technology Chapter Two: Display Manufacturing, William C. O'Mara, pp. 93, 94–97, Chapter three: Product Materials, pp. 149–153, Chapter Four: Manufacturing Equipment, p. 198.

*Primary Examiner*—Mahshid D. Saadat
*Assistant Examiner*—Teresa M. Arroyo

[57] ABSTRACT

A connecting device, and corresponding method, for connecting a semiconductor chip/chip and a conductor, the connecting device including: a pad formed on the chip; a passivation layer formed around the pad thereby defining an aperture in the passivation layer; a pad-to-bump connecting layer at least in the aperture; and a bump, formed on the pad-to-bump connecting layer, not extending laterally outside of the aperture. The passivation layer is also formed on an edge area of the pad so as to define shoulder portions between which the aperture is located. The pad-to-bump connecting layer includes: a first base layer formed in the aperture and also on the shoulder portions of the passivation layer so that the first base layer extends laterally outside the aperture; and a second base layer formed at least in the aperture. The cross-sectional area of the bump is less than the cross-sectional area of the aperture.

19 Claims, 5 Drawing Sheets

FIG· 2
PRIOR ART
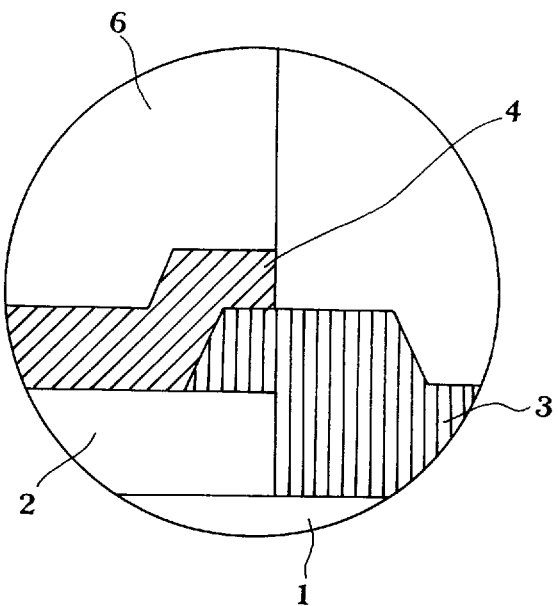

FIG·3
PRIOR ART
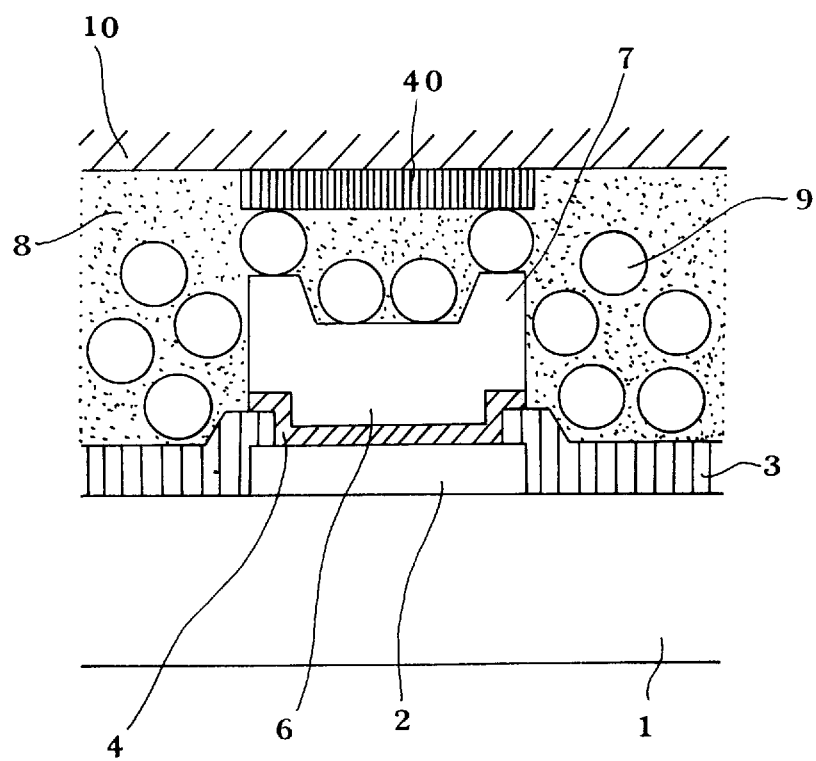

FIG·5
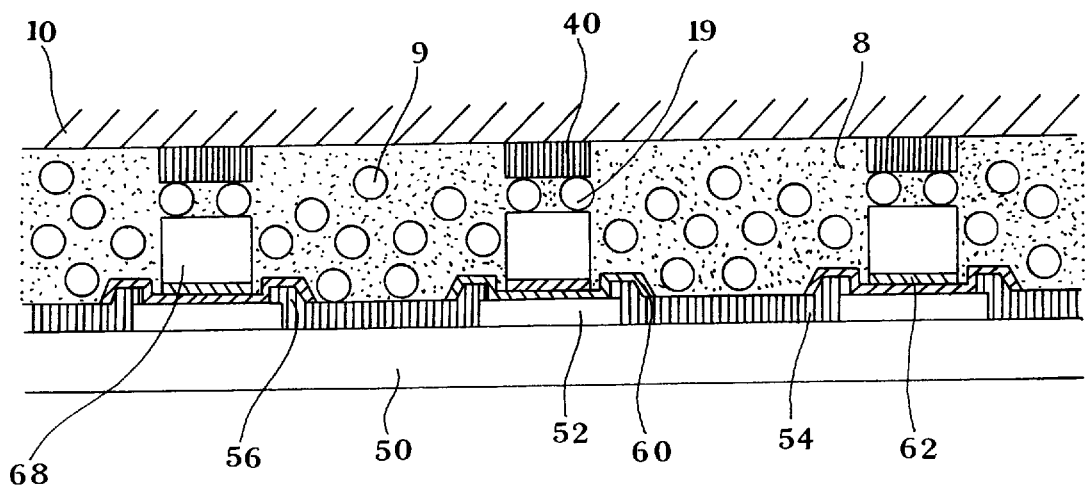

CONNECTING DEVICE FOR CONNECTING A SEMICONDUCTOR CHIP TO A CONDUCTOR

BACKGROUND OF THE INVENTION

1. Field of the Invention

The present invention is directed to an improved connecting device for connecting a semiconductor chip to a conductor, i.e., a chip on glass bonding device for attaching a semiconductor element, and a method thereof, and more particularly, to a chip on glass bonding device for a semiconductor element, which includes a very flat bump attachment.

2. Description of Related Art

Integrated circuit ("IC") drivers are an important aspect of flat panel display systems, e.g., liquid crystal displays ("LCDs"). Several integrated circuits might be necessary to drive an LCD. Positioning these ICs on the periphery of the display panel requires special techniques that minimize the space consumed, and the weight contributed by, the ICs and their connections.

There are three established techniques for packaging IC drivers onto the flat display panel: chip on board ("COB"); chip on film ("COF"); and chip on glass ("COG"). Of these, the COG technique offers the highest density of pin-outs, i.e., IC connection density.

These techniques form a bump onto a semiconductor wafer. An IC chip is then cut from the semiconductor wafer. Subsequently, the IC chip is attached, e.g., to a display panel periphery, using the bump. The bump connects to a terminal, e.g., an indium tin oxide ("ITO") conductor on the display panel, such that an electrical connection is made via electrically conductive balls dispersed in an electrically conductive adhesive.

FIGS. 1, 2 and 3 show a conventional method of bump manufacture for use in an LCD. As shown in FIG. 1(b), the method involves an IC chip 1, a pad 2 composed of aluminum or aluminum alloy and formed on the wafer 1, and a passivation layer 3 formed on the pad 2 for constraining an aperture 11 that is disposed on the pad 2 by way of an ordinary photolithography process. The portions where the passivation layer 3 conforms to the ends of the pad 2 are referred to as the shoulders 3a.

Thereafter, as shown in FIG. 1(b), a base metal layer 4 is formed on the passivation layer 3 and the pad 2. The base metal layer 4 prevents intermetallization, that would otherwise occur, between the bump 6 and pad 2, thereby enhancing conductance between these two. In addition, the base metal layer 4 improves the strength of the adhering force between the aluminum pad 2 and a bump 6.

As shown in FIG. 1(c), a photoresist layer 5 is formed on the base metal layer 4. An aperture 12 is formed in the photoresist layer 5 by patterning. As shown in FIG. 1(d), a bump 6 is formed by an electroplating method. As shown in FIG. 1(e), the remaining photoresist is removed. Then, the base metal layer 4 is removed where it is not covered by the bump 6, the bump 6 having been protectively masked.

As shown in FIG. 2, the base metal layer must conform to the stepped configuration that is characteristic of the shoulder portions 3a where the passivation layer 3 is formed on an edge area of the pad 2. As is well known, the adhering force is weakest where a layer must conform to discontinuities in a surface, e.g., a right angle. In other words, the portions of the bump-to-(base metal layer)-to-(shoulder portion) are more susceptible to etchant seeping in and weakening the connection. It would be desireable to not form the bump over the shoulder portions of the passivation layer 6, thereby eliminating the inherently weaker adhering forces found over the shoulder portions.

The bottom corners of the bump 6 are formed on a folded portion of the metal layer 4 where the metal layer 4 conforms to the shoulders 3a of the passivation layer 3. The parts of the bump 6 formed on the folded portion of metal layer 4 are higher than a portion formed on the aluminum pad 2, so that a corresponding projection 7 is formed on the upper surface of the bump 6, as shown in FIG. 1(e). The projections 7 are defects.

FIG. 3 shows terminal 40, on a display panel periphery 10, to which the bump 6 is adhered, the bump 6 having been made by the method depicted in FIGS. 1(a)–1(e). A plurality of electrically conductive balls 9 and an electrically conductive adhesive resin 8 are put between the bump 6 and the terminal 40. The electrically conductive adhesive resin 8 is compressed, so that the plurality of electric conductive balls 9 adheres to the bump 6 and the terminal 40.

Each conductive ball 9, located within the conductive resin 8, has a diameter of about 5–7 $\mu$m, and a projection on the upper surface of the bump 6 has the height of about 1.2 $\mu$m. When the plurality of conductive balls 9 are placed between the bump 6 and the terminal 40, the balls 9 do not adhere uniformly to the terminal 40, causing the adhering surface to be small, thereby causing the flow of electric current to be imperfect. Therefore, it is a problem to eliminate the projections 7 that correspond to the shoulders 3a of the passivation layer 3.

SUMMARY OF THE INVENTION

Accordingly, it is an object of the present invention to provide a chip-on-glass bonding device (for attaching a semiconductor element) and a method thereof, which eliminates the above problems encountered with the conventional bonding devices and the conventional methods thereof.

Another object of the present invention is to provide an improved chip-on-glass bonding device (for attaching a semiconductor element) and an improved method thereof, which includes a bump having good surface flatness. The method of the present invention can form a precision pin in a semiconductor chip, and the bonding (or semiconductor chip connecting) device can provide a high density of pads by reducing the width of each bump.

The objects of the present invention are fulfilled by providing a connecting device for connecting a semiconductor chip and a conductor, the connecting device comprising: a pad formed on the wafer; a passivation layer formed around the pad thereby defining an aperture in the passivation layer; a pad-to-bump connecting layer at least in the aperture; and a bump, formed on the pad-to-bump connecting layer, not extending laterally outside of the aperture.

The objects of the present invention also are fulfilled by providing a method of forming a connecting device for connecting a semiconductor chip and a conductor, the method comprising the steps of: forming a pad on the wafer; forming a passivation layer around the pad thereby defining an aperture in the passivation layer; forming a pad-to-bump connecting layer at least in the aperture; and forming a bump on the pad-to-bump connecting layer, the bump not extending laterally outside of the aperture.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein:

FIG. 2 is an enlarged sectional view of the portion A of FIG. 1(e);

FIG. 3 is a sectional view of an adhering state between a conventional bump and a periphery of a display panel;

FIG. 5 is a sectional view of an adhering state between a bump and a periphery of a display panel according to the present invention.

DETAILED DESCRIPTION OF THE PREFERRED EMBODIMENTS

The drawings illustrate the preferred embodiments of the present invention, namely an attachment bump used to attach a semiconductor element to a display panel periphery, and the method therein, as shown in FIGS. 4(a) to 4(f).

Figure 4A:
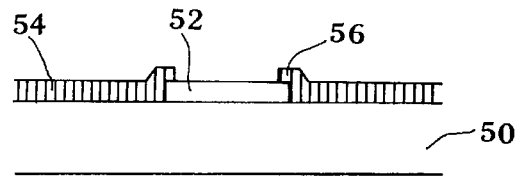
FIGS. 4(a) to 4(f) are diagrammatic sectional views of a method forming a bonding device for a semiconductor element according to the present invention.
Figure 4B:
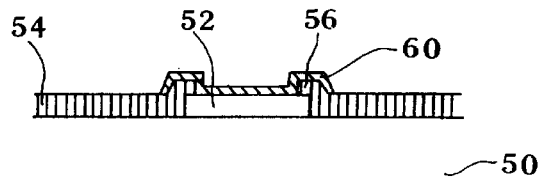
Figure 4C:
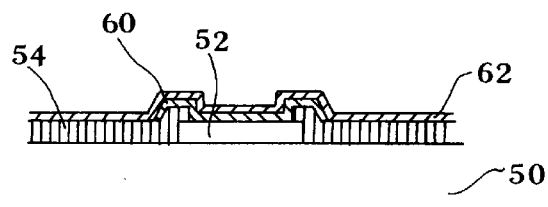

In FIG. 4(a), first a pad 52 and then a passivation layer 54, including an aperture 58 disposed over the pad 52, is formed on the IC wafer (or chip) 50. In FIG. 4(b), a first base metal layer 60, which is wider than the aperture 58, is formed on the pad 52 and the shoulders 56 of the passivation layer 54. In FIG. 4(c), a second base metal layer 62 is formed on the first base metal layer 60 and the passivation layer 54.

Figure 4D:
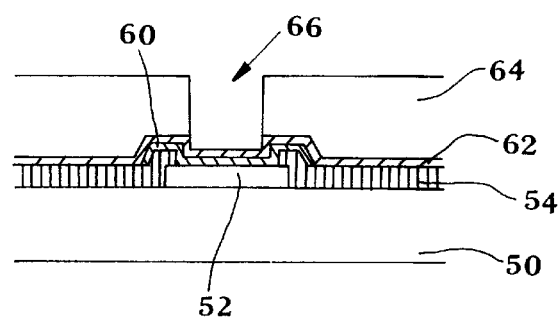

In FIG. 4(d), a photoresist 64 is formed on the second base metal layer 62. An aperture 66 is photolithographically formed into the photoresist 64. The aperture 66 is narrower than the space between the shoulders 56, thus the aperture 66 is more narrow than the aperture 58. The bump 68 is formed in the aperture 66 by electroplating.

Figure 4E:
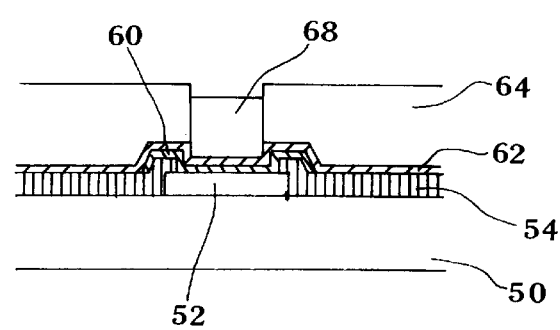
Figure 4F:
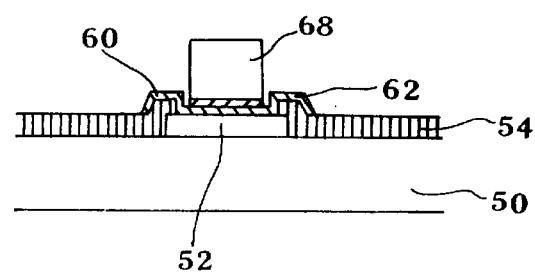

In FIG. 4(f), the photoresist 64 is removed. Then, the second base metal layer 62 is removed everywhere except under the bump 68. The pair, defined as the remaining portion of the first base metal layer 60 and the remaining portion of the second base metal 62, are electrically independent from all other such pairs under bumps 68 on the wafer/chip 50, as is consistent with the pair functioning as a pin of the wafer/chip 50.

In FIG. 4(a), after the pad 52, composed of aluminum or aluminum alloy, is formed on the wafer 50, the passivation layer 54 is formed by a photolithography process. The aperture 58 is of a smaller width than that of the aluminum pad 52. The pad 52 can be made of electric conductive materials other than aluminum or an aluminum alloy. The passivation layer 54 is, for example, a polyamide layer.

In FIG. 4(b), the first base metal layer 60 extends beyond the aperture 58 in the passivation layer 54 such that it covers the shoulders 56 of the passivation layer 54. The first base metal layer 60 is made, for example, of Ti/Au alloy, which has good adhering strength, and remains unaffected when the electroplating liquid and the second base metal layer are removed.

Figure 1A:
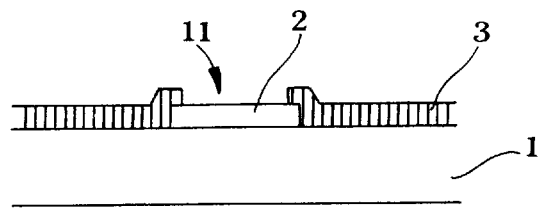
FIGS. 1(a) to 1(e) are conventional partially diagrammatic sectional views of a method of forming a bonding device for a semiconductor element.
Figure 1B:
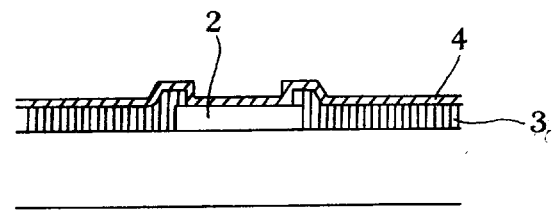
Figure 1C:
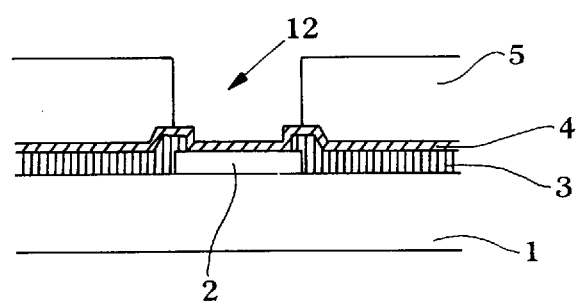
Figure 1D:
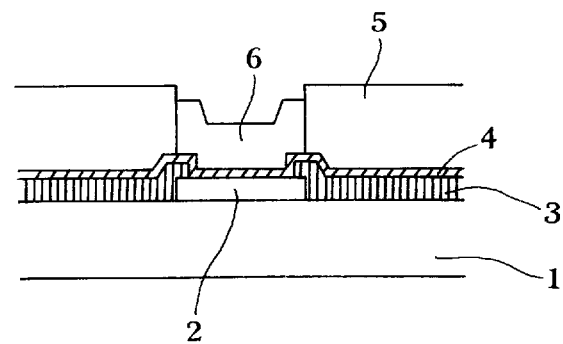

The second base metal layer 62, in FIG. 4(c), is formed on the entire wafer 50 (e.g., by a sputtering method, for example, as mentioned in the discussion of FIG. 1(c)). The second base metal layer 62: (1) functions to prevent intermetallization (spreading of metal elements from the bump 68 to the pad 52, i.e., as an anti-spreading wall); (2) functions as a good adhering layer, i.e., it adheres strongly to a front surface of the wafer 50; and (3) functions as a seed metal in the electroplating process, e.g., as illustrated in FIG. 4(e).

Figure 1E:
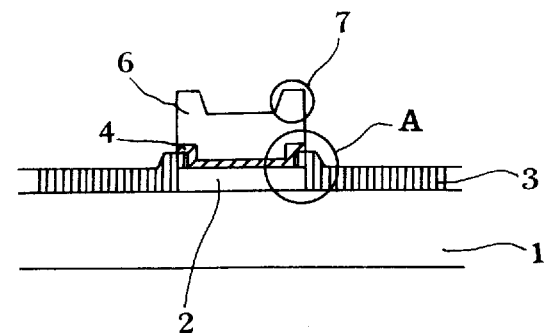

In FIG. 4(d), the photoresist 64 is formed on the second base metal layer 62. The photoresist aperture 66 is smaller than the aperture 58 in the passivation layer 54. As shown in FIG. 1(e), the bump 68 is formed within the photoresist 66.

Finally, in FIG. 4(f), the bump 68 is completed by removing the second base metal layer 62 except under the bump 68. Removal of the second base metal layer 62 occurs after removal of the photoresist 64. The bump 68 is made, e.g., of gold or a gold alloy, but conductive materials such as copper could be used. The bump 68 provides the interface between a semiconductor chip and an ITO conductor deposited on the surface of the display panel.

As shown in FIG. 5, even though the IC wafer 50 and part of the aluminum pad 52 are covered with the passivation layer 54, a plurality of apertures remain such that the aluminum pads 52 remain partially exposed. Accordingly, the first base metal layer 60 covers the exposed portion of the aluminum pad 52 and the shoulders 56 of the passivation layer 54. Therefore, the first base metal layer 60 protects the aluminum pad 52 from the electroplating process and the removal of the second base metal layer 62.

The second base metal layer 62 is formed on the flat center portion of the first base metal layer 60 and is of a smaller width than that of the aperture 58 of FIG. 4(a) because all that remains of the second base metal layer 62 is the portion underneath the bump 68 (which is formed in the aperture 66 (FIG. 4(f)).

Accordingly, because the bump 68 is formed only on the flat center portion of the first base metal layer 60, the bump 68 is smaller in width, and so there are no projections (such as 7 of FIG. 1(e)) on the upper surface of the bump 68 (which is adhered to the terminal 40). Therefore, when a conductive adhesive resin 8, including a plurality of conductive balls 9, is put between the bump 68 and the terminal 40 and is pressed, the upper surface of the bump 68 is uniformly adhered to the terminal 40. Consequently, the adhering surface is expanded.

The connecting device of the present application, and the method of forming such a connecting device, can be used with the COG techique, COB technique, and the COF technique.

The COG bonding/connecting device, and the method thereof, according to the present invention exhibits excellent adhering qualities. Also, the COG bonding device of the present invention makes it possible to form a precision pin because smaller diameter conductive balls 19 can be used due to uniformity of the upper surface of the bump 68, thereby leading to a higher density of pads (because the width of the pad can be relatively smaller due to formation of a bump 58 that is smaller in width than the aperture member 66 of the passivation layer 13.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A connecting device for connecting a semiconductor chip and a conductor, the connecting device comprising:
   a pad formed on the chip;
   a passivation layer formed around the pad thereby defining an aperture in the passivation layer;
   a pad-to-bump connecting structure formed at least in the aperture, the pad-to-bump connection structure including a first base layer and a second base layer, a lateral dimension of the first base layer being greater than a lateral dimension of the second base layer, and the second base layer not extending laterally over the passivation layer; and
   a bump, formed on the pad-to-bump connecting structure, a lateral dimension of a lower surface of the bump being substantially equal to the lateral dimension of the second base layer.

2. A device as in claim 1, wherein:
   the passivation layer is also formed on an edge area of the pad thereby defining shoulder portions between which the aperture is located; and
   wherein the first base layer is formed also on the shoulder portions of the passivation layer such that the first base layer extends laterally outside the aperture.

3. A device as in claim 1, wherein:
   the pad-to-bump connecting structure is metal.

4. A device as in claim 1, wherein:
   a cross-sectional area of the bump is less than a cross-sectional area of the aperture.

5. A device as in claim 1, wherein the first base layer is formed on the pad and the second base layer is formed on the first base layer.

6. A device as in claim 1, wherein:
   at least one of the first base layer and the second base layer is a Ti/Au alloy.

7. A device as in claim 1, wherein:
   the bump is one of gold or a gold alloy.

8. A device as in claim 1, wherein:
   the bump has a substantially flat upper surface and lower surface.

9. A device as in claim 1, wherein:
   the pad is located on a periphery of a liquid crystal display panel.

10. A device as in claim 1, wherein:
    the pad is an aluminum or aluminum alloy.

11. A device as in claim 1, wherein a top surface and a bottom surface of the bump are flat.

12. A device as in claim 1, wherein the bump is formed by an electroplating process.

13. A device as in claim 1, wherein a lateral dimension of the bump is smaller than the lateral dimension of the first base layer.

14. A device as in claim 1, wherein the lateral dimension of the second base layer is smaller than a lateral dimension of the aperture.

15. A device as in claim 1, wherein the first base layer substantially overlaps the passivation layer.

16. A liquid crystal display device comprising:
    a liquid crystal display panel;
    at least one integrated circuit; and
    at least one connecting device for making a connection between the integrated circuit and the display panel;
    wherein the connecting device includes:
       a pad formed on the chip;
       a passivation layer formed around the pad thereby defining an aperture in the passivation layer;
       a pad-to-bump connecting structure formed at least in the aperture, the pad-to-bump connection structure including a first base layer and a second base layer, a lateral dimension of the first base layer being greater than a lateral dimension of the second base layer, and the second base layer not extending laterally over the passivation layer; and
       a bump, formed on the pad-to-bump connecting structure, a lateral dimension of a lower surface of the bump being substantially equal to the lateral dimension of the second base layer.

17. A device as in claim 12, wherein:
    the integrated circuit is a display driver circuit.

18. A device as in claim 16, wherein:
    the integrated circuit is located on the periphery of the display panel.

19. A device as in claim 16, wherein a top surface and a bottom surface of the bump are flat.

* * * * *